USO05565247A

United States Patent [19]

Suzuki

[11] Patent Number: 5,565,247
[45] Date of Patent: Oct. 15, 1996

[54] PROCESS FOR FORMING A FUNCTIONAL DEPOSITED FILM

[75] Inventor: Nobumasa Suzuki, Yokohama, Japan

[73] Assignee: Canon Kabushiki Kaisha, Tokyo, Japan

[21] Appl. No.: 433,193

[22] Filed: May 2, 1995

Related U.S. Application Data

[63] Continuation of Ser. No. 50,003, filed as PCT/JP92/01111 Aug. 31, 1992, abandoned.

[30] Foreign Application Priority Data

Aug. 30, 1991  [JP]  Japan ..................... 3-220006

[51] Int. Cl.$^6$ ........................................ B05D 3/06
[52] U.S. Cl. .................. 427/562; 427/563; 427/564; 427/571
[58] Field of Search .................... 427/562, 563, 427/564, 571

[56] References Cited

U.S. PATENT DOCUMENTS

| H566 | 1/1989 | Nyaiesh et al. | 427/571 |
|---|---|---|---|
| 4,282,267 | 8/1981 | Küyel | 427/563 |
| 4,443,488 | 4/1984 | Little et al. | 427/562 |
| 4,526,805 | 7/1985 | Yoshizawa | 427/562 |
| 4,532,199 | 7/1985 | Ueno et al. | 427/563 |
| 4,871,580 | 10/1989 | Schram et al. | 427/562 |
| 4,996,077 | 2/1991 | Moslehi et al. | 427/562 |
| 5,180,435 | 1/1993 | Markunas et al. | 427/563 |
| 5,204,144 | 4/1993 | Cann et al. | 427/571 |
| 5,312,778 | 5/1994 | Collins et al. | 427/571 |
| 5,453,305 | 9/1995 | Lee | 427/562 |
| 5,464,499 | 11/1995 | Moslehi et al. | 427/571 |

FOREIGN PATENT DOCUMENTS

| 61-213377 | 9/1986 | Japan. |
|---|---|---|
| 62-235484 | 10/1987 | Japan. |
| 1295422 | 11/1989 | Japan. |

Primary Examiner—Marianne Padgett
Attorney, Agent, or Firm—Fitzpatrick, Cella, Harper & Scinto

[57] ABSTRACT

A process for forming a functional deposited film by way of RF plasma CVD process, comprising generating plasma in a substantially enclosed plasma generation chamber provided with an electrode arranged at the periphery of said plasma generation chamber by applying a RF power through said electrode into said plasma generation chamber, and forming said functional deposited film on a substrate placed in a deposition chamber communicated with said plasma generation chamber, wherein said substrate is arranged so as to isolate from a zone where said plasma is generated, characterized by comprising causing a magnetic field in said plasma generation chamber by means of a magnetic field generation means such that a magnetic flux density with a maximum intensity in the range of from 500 to 1000 Gauss is provided on the inner wall face side of and in parallel to the inner wall face of said plasma generation chamber; supplying a plasma generating raw material gas to a zone where said magnetic field resides; applying a RF power through said electrode to said zone to excite and decompose said plasma generating raw material gas thereby forming a high density plasma region localized in a doughnut-like shaped state while producing active species; introducing a film-forming raw material gas reactive with said active species into said deposition chamber to chemically react said film-forming raw material gas with said active species, wherein a ratio of Nee/Nes which is expressed by a ratio between an electron density Nes in the vicinity of said substrate and an electron density Nee in the vicinity of said electrode is adjusted to be 100 or more, and the relationship between a distance D between said electrode and said substrate and an inner pressure P in said deposition chamber is adjusted to satisfy the equation $0.5 \leq P \times D \leq 5$, whereby the formation of a functional deposited film is caused on said substrate.

9 Claims, 5 Drawing Sheets

PROCESS FOR FORMING A FUNCTIONAL DEPOSITED FILM

This application is a continuation of application Ser. No. 08/050,003 (National Phase Application for PCT JP92/01111) filed Aug. 31, 1992, now abandon.

FIELD OF THE INVENTION

The present invention relates to a process for forming a functional deposited film which is usable in the preparation of semiconductor devices, electronic circuits, and the like. More particularly, the present invention relates to a process for forming a functional deposited film on a substrate by way of RF plasma CVD process wherein film formation is conducted by producing plasma with the use of a RF power source and which makes it possible to markedly reduce ion bombardment to the substrate which will be caused due to the plasma produced, thereby forming a high quality deposited film at a high deposition rate.

BACKGROUND OF THE INVENTION

Semiconductor films and insulating films as the constituents of semiconductor devices and electronic circuits (particularly, VLSIs) are formed by various film-forming methods. Such film-forming method includes vacuum evaporation process, sputtering process, CVD process, and plasma CVD process. Of these film-forming processes, the plasma CVD process has the most popularly used since it is advantageous in that the quality of a film to be formed can be relatively easily controlled as desired. For instance, the plasma CVD process has been generally employed in the case of forming a thin film such as Si films used as the semiconductor layer, SiN films used as the protective film, and $SiO_2$ films used as the interlayer dielectric film of a semiconductor device.

In the case of forming a deposited film by way of the plasma CVD process, the film formation is generally conducted while contacting a substrate on which the deposited film is to be formed with plasma having a plasma density of $1\times10^{10}/cm^3$ or more, wherein a RF (Radio Frequency) with a frequency of 13.56 MHz or a microwave with a frequency of 2.45 GHz is used as the excitation source for producing said plasma. Now, the plasma CVD process with the use of a RF has advantages in that plasma can be relatively easily stabilized and a deposited film of relatively good quality can be obtained but it is accompanied by a disadvantage in that a high deposition rate is hardly attained. On the other hand, as for the plasma CVD process with the use of a microwave, it has advantages in that raw material gas is decomposed at a high efficiency and a high deposition rate can be attained but it is accompanied by a disadvantage in that it is difficult to stably form a deposited film of good quality while maintaining plasma in a stable state.

In these plasma CVD processes, ions in the plasma are accelerated by a sheath electric field formed at a contact face between the substrate and the plasma and they are radiated to the substrate at an energy of some tens to 100 eV, and because of this, a deposited film formed on the substrate unavoidably suffers from a so-called plasma damage to a certain extent. Further, in these plasma CVD processes using organic gas such as tetraethoxysilane, tetramethoxysilane, or the like as the film-forming raw material gas, there are problems such that undesirable reactions such as dissociation of C—H bond are occurred, resulting in causing contamination of carbon atoms dissociated into the deposited film formed, and because of this, it is difficult to stably form the deposited film in high quality.

In order to solve these problems, there has been proposed a so-called remote plasma CVD process wherein a plasma generation chamber is isolated from a film-forming chamber in which a substrate on which a film is to be formed to prevent a deposited film formed on the substrate from suffering from such a plasma damage as above described. An example of such remote plasma CVD process can be found in U.S. Pat. No. 4,066,037. The plasma CVD apparatus disclosed in this patent literature is of the constitution shown in FIG. 4. The plasma CVD apparatus shown in FIG. 4 comprises a deposition chamber 401 having a plasma generating coil 408 wound around the exterior thereof, wherein the coil 408 is electrically connected to a RF power source (not shown). Reference numeral 402 indicates an electric heater disposed in the inside of the film-forming chamber 401. Reference numeral 405 indicates a substrate on which a film is to be formed which is arranged on the heater 402. The deposition chamber 401 is provided with an exhaust pipe connected to a vacuum pump which serves to evacuate the inside of the deposition chamber 401. Each of reference numerals 403 and 404 indicates a gas feed pipe. Gas supplied through the gas feed pipe 403 is spouted out through gas liberation holes 406 provided at a gas dispersion head 409 disposed in the deposition chamber 401. On the other hand, gas supplied through the gas feed pipe 404 is spouted out into the deposition chamber 401 through a gas dispersion device 407 which is disposed at an upper position of the deposition chamber 401.

The gas supplied through the gas feed pipe 403 includes monosilane gas ($SiH_4$). The gas supplied through the gas feed pipe 404 includes nitrogen gas ($N_2$) and argon gas (Ar).

SUMMARY OF THE INVENTION

The formation of a silicon nitride film using the plasma CVD apparatus shown in FIG. 4 is conducted, for example, in the following manner. That is, the inside of the deposition chamber 401 having a substrate 405 arranged therein is evacuated to a vacuum of about $10^{-6}$ Torr, and the substrate 405 is heated to and maintained at a temperature of about 300° C. by actuating the heater 402. Successively, nitrogen gas is introduced into the deposition chamber 401 through the gas feed pipe 404, simultaneously with this, silane gas is introduced thereinto through the gas feed pipe 403. Then, the RF power source connected to the coil 408 is switched on, when a glow discharge zone is caused in the inside of the deposition chamber 401 which is surrounded by the coil 408, wherein the nitrogen gas is activated to produce active species upon passing through the glow discharge zone, which are successively transported toward the substrate 405. In this case, the silane gas is introduced into the space in the vicinity of the substrate 405 through the gas liberation holes 406, while the nitrogen gas passes through the glow discharge zone where it is activated to produce active species, which are followed by arriving at the substrate 405. Wherein, the silane gas is contacted and chemically reacted with the active species of the nitrogen gas to cause the formation of a silicon nitride film on the substrate 405.

The above-mentioned U.S. patent literature describes that a relatively uniform dielectric film or a silicon nitride film of a good stoichiometric composition can be obtained by using the above plasma CVD apparatus. Although the isolated-plasma CVD process disclosed in the above U.S. patent literature has such an advantage, it has shortcomings in that the deposition rate upon forming such deposited film is about 600 Å/min at the most and a satisfactory deposition rate is hardly attained, especially at the time of forming a relatively thick deposited film.

The present inventor has formed a plurality of deposited films using the above plasma CVD apparatus, and for each of the deposited film obtained, measured a leakage current. As a result, it has been found that all the deposited films have relatively large leakage current, and it is therefore extremely difficult to form a high quality deposited film which satisfies the conditions relating to stablity and lifetime of semiconductor devices and electronic circuits in terms of a final product. The present inventor also has found that using the plasma CVD apparatus of the above patent literature films are deposited on the inner wall face of the deposition chamber positioned between the plasma generation space and the substrate. Part of those films deposited are removed intermittently from the inner wall face of the deposition chamber and contaminate a film deposited on the substrate during film formation. Thus, it has been found that the remote plasma CVD process disclosed in the above U.S. patent literature is not practical.

The principal object of the present invention is therefore to eliminate the foregoing problems in the conventional film-forming method by way of the above-described plasma CVD process and to provide an improved film-forming method which enables one to efficiently form a deposited film which satisfies the conditions relating to characteristics required for a semiconductor film to be used as a constituent of semiconductor devices and electronic circuits.

Another object of the present invention is to provide a deposited film-forming method which enables one to form a functional deposited film on a substrate at a high deposition rate and in a state substantially free of plasma damage, wherein a plasma generation region is localized in a doughnut-like shape and the substrate is arranged such that it is isolated from the plasma generation region.

A further object of the present invention is to provide an improved film-forming method with the use of a RF power as an energy source to produce plasma which enables one to attain a high raw material gas utilization efficiency and to efficiently form a functional deposited film.

The present inventor has made studies through experiments, which will be hereunder described, aimed at solving the foregoing problems in the conventional film-forming method and attaining the above objects. As a result, the present inventor have obtained a finding that a desirable functional deposited film of dense texture, which is substantially free of leakage current or for which a leakage current is so slight that it is hardly detected, can be formed at a markedly high deposition rate when film formation is conducted by using a magnetic field generation means capable of causing a magnetic field in a plasma generation chamber; forming a magnetic field in the vicinity of a RF electrode disposed at the plasma generation chamber by means of the magnetic field generation means such that said magnetic field is situated in parallel to an inner wall face of the circumferential wall of the plasma generation chamber, wherein said magnetic field is adjusted to be in the range of 500 to 1000 Gauss in terms of flux density of the magnetic field portion with a maximum intensity; introducing a plasma generating raw material gas into the plasma generation chamber; applying a RF power into the plasma generation chamber through the RF electrode whereby plasma is generated such that it is localized in a doughnut-like state with a high density, to thereby form a doughnut-like shaped plasma region comprising active species resulted from the raw material gas; and introducing a film-forming raw material gas, which is reactive with said active species, into a film-forming chamber in which a substrate on which a film is to be formed is arranged, wherein a ratio of Nee/Nes between an electron density Nes in the vicinity of the substrate and an electron density Nee in the vicinity of the RF electrode is adjusted to be 100 or more and the relation between a distance D between the RF electrode and the substrate and an inner pressure P of the film-forming chamber is adjusted so as to satisfy the equation $0.5 \leq P \times D \leq 5$.

The present invention has been accomplished based on the above finding obtained by the present inventor through the experiments.

The gist of the present invention is of such constitution as will be described in the following. That is, it resides in an improvement in a process for forming a functional deposited film by way of RF plasma CVD process wherein plasma is generated in a substantially enclosed plasma generation chamber provided with a RF electrode at the periphery thereof by applying a RF power into the plasma generation chamber through said RF electrode and a functional deposited film is formed on a substrate for film formation which is arranged in a deposition chamber communicated with the plasma generation chamber such that said substrate is isolated from a region where the plasma is generated in the plasma generation chamber, the improvement comprises forming a magnetic field of 500 to 1000 Gauss in terms of flux density of the magnetic field portion with a maximum intensity in such a state that it resides on the inner wall face side of and in parallel to the circumferential wall of the plasma generation chamber; supplying a plasma generating gas into a zone where the magnetic field resides through a gas feed means, simultaneously with this, applying a RF power through the RF electrode into the plasma generation chamber, whereby plasma is generated such that it is localized in a doughnut-like state with a high density, to thereby form a doughnut-like shaped plasma region comprising active species resulted from the raw material gas; and introducing a film-forming raw material gas, which is reactive with said active species, into the deposition chamber in which the substrate on which a film is to be formed is arranged, wherein said film-forming raw material gas is chemically reacted with the active species, and wherein a ratio of $N_{ee}/N_{es}$ between an electron density $N_{es}$ in the vicinity of the substrate and an electron density $N_{ee}$ in the vicinity of the RF electrode is adjusted to be 100 or more, and the relation between a distance D between the RF electrode and the substrate and an inner pressure P of the deposition chamber is adjusted so as to satisfy the equation $0.5 \leq P \times D \leq 5$, whereby causing the formation of a functional deposited film on the substrate.

According to the present invention of the above constitution, there can be efficiently formed a extremely dense and homogeneous functional deposited film having a uniform thickness, which is substantially free of leakage current or for which a leakage current is slight to such an extent that it is hardly detected, and which is usable as a constituent in electronic devices such as semiconductor devices and electronic circuits, at a markedly high deposition rate.

In the following, description will be made of the experiments which were carried out by the present inventor.

Experiment 1

In this experiment, there were prepared a plurality of deposited films by introducing a plasma generating gas into the plasma generation chamber 101 of a film-forming apparatus through a different position of the plasma generation chamber in each case. And as for each of the deposited films, evaluation was made with respect to deposition rate upon the film formation, leakage current, electrical resistivity, electrical withstand voltage, and defect density.

Each of the deposited films was formed using a film-forming apparatus of the constitution shown in FIG. 1(A) and FIG. 1(B). The film-forming apparatus shown in FIG. 1(A) comprises a plasma generation chamber 101 comprising a cylindrical quartz tube which is provided with a ring-like shaped electrode 108 arranged about the outer wall face thereof. The electrode 108 is electrically connected to a RF power source 107. Reference numeral 105 indicates a substrate on which a film is to be formed, arranged on a substrate holder 102 which is positioned below the plasma generation chamber 101 comprising the quartz tube. The substrate holder 102 is provided with a resistive heater 103 which serves to maintain the substrate 105 at a predetermined temperature. Reference numeral 104' indicates an exhaust system connected to a vacuum pump (not shown). Reference numeral 109 indicates a gas feed pipe which serves to introduce a plasma generating raw material gas into the plasma generation chamber 101. Reference numeral 111 indicates a guide member which serves to adjust the position for the plasma generating raw material gas to be introduced into the plasma generation chamber. The guide member is designed such that it can be shrunk upward or extended downward in order to adjust the position for the plasma generating gas to be introduced. Reference numeral 106 indicates a ring-shaped gas feed means which serves to introduce other raw material gas. The ring-shaped gas feed means is provided with a plurality of gas liberation holes. The raw material gas supplied through the ring-shaped gas feed means is introduced into a deposition chamber 104. Reference numeral 110 indicates a top cover member which serves to hermetically cover the plasma generation chamber 101.

FIG. 1(B) is a schematic cross section view, taken along the X–Y line in FIG. 1(A) and viewed from above.

In this experiment, there were provided a plurality of p-type single crystalline silicon plates (crystal plane :(100), resistivity: 10 Ω.cm) as the substrate 105. On each of the silicon plates, there was formed a silicon nitride film wherein the position for the plasma generating raw material gas to be introduced was changed by sliding the gas introduction position adjusting guide member 111 in each case. In each case, there was observed an electron density by means of a probe disposed at the top of the guide member 111, wherein the electron density was measured in accordance with the conventional Langmuir probe method. Particularly, a different voltage of −50 V to +50 V was applied to the probe and the electric current flown into the probe was measured. On the basis of the measured results, there was obtained a I–V curve. From the I–V curve, there was obtained an electron density.

The formation of the silicon nitride film was conducted in the following manner. That is, the silicon plate as the substrate 105 was placed on the substrate holder 102. The plasma generation chamber 101 and the deposition chamber 104 were evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a vacuum of 0.1 Torr by adjusting a conductance valve (not shown) provided at the exhaust system 104'. Successively, the RF power source 107 was switched on to apply a RF power of 500 W (13.56 MHz) into plasma generation chamber 101 through the electrode 108, whereby plasma was generated in the plasma generation chamber 101, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 0.5 μm on the silicon substrate 105.

The above procedures of forming a silicon nitride film were repeated five times, except that in each case, the position for the nitrogen gas to be introduced into the plasma generation chamber 101 was changed to one of five different positions, which will be described in the following. That is, position A in which the gas introduction position adjusting guide member 111 is extended to a position situated at the center of the RF electrode 108 in the plasma generation chamber, position E in which the gas introduction position adjusting guide member 111 is smaller in the direction toward the top cover member 110 of the plasma generation chamber 101, and positions B, C, and D respectively corresponding to a position in which the distance between the position A and the position E is divided into three at an equal interval.

Thus, there were obtained five silicon nitride film samples. As for each of the five silicon nitride film samples, evaluation was made with respect to electron density upon film formation, film deposition rate, leakage current, electric resistivity, electric withstand voltage, and defect density. As a result, in the evaluation of electron density, it was found that a maximum electron density is provided in the case of the gas introduction position A which is in the vicinity of the RF electrode 108, and the density of electron gradually reduces while electrons being gradually spread in the entire space of the plasma generation chamber 101 as the position for the nitrogen gas introduced becomes distant from the RF electrode. Particularly, it was found that the ratio of Nee/Nes between the electron density (Nes) in the vicinity of the substrate and the electron density (Nee) in the vicinity of the RF electrode, namely the plasma confinement degree in other words, is as low as about 20.

The evaluation of film deposition rate was conducted in such a manner that the deposited film sample is subjected to patterning by means of photolithography technique; a step of the patterned film sample is measured by means of a stylus profiler (commercially available under the trade name Alpha Step) to obtain a film thickness; and the measured film thickness is divided by a value corresponding to the period of time spent for the formation of the deposited film sample.

The evaluation of leakage current was conducted based on a value obtained in a manner that an Al electrode is formed on the deposited film sample; a prescribed direct current voltage is applied to the deposited film sample through the Al electrode so as to cause an electric field of 5 MV/cm, wherein an electric current flown is measured. The evaluation of electric resistivity was conducted based on a value by dividing the value of the above electric field by the value of leakage current obtained in the above.

The evaluation of withstand voltage was conducted based on an electric field when a leakage current of more than $1\times10^{-6}$ A/cm$^2$ flowed in the deposited film sample.

The evaluation of defect density was conducted based on a spin density obtained by subjecting the deposited film sample to measurement by means of an electron spin resonance (ESR) device. These evaluations were conducted for each of the five deposited film samples.

The evaluated results showed that the deposition rate, leakage current, electric resistivity, withstand voltage, and defective density are more or less around the same for each of the five deposited film samples which were formed with a varied position for the plasma generating raw material gas to be introduced into the plasma generation chamber. It was also found that in the case of the apparatus shown in FIG. 1(A) of a capacitive-coupled type which was used in this experiment, plasma is liable to spread in the plasma generation chamber 101, and this situation is similar that in the case of using such a RF inductive coupled type apparatus as disclosed in U.S. Pat. No. 4,066,037.

Experiment 2

In this experiment, there was used an apparatus shown in FIG. 2 which comprises a partial modification of the apparatus shown in FIG. 1(A) in which a magnetic field generation means 212 capable of generating a magnetron magnetic field in a state of being perpendicular to an electric field provided is disposed at the periphery of the RF electrode of the latter apparatus in order that the resulting plasma is centralized in the vicinity of the RF electrode without being diffused near the substrate. Using the apparatus thus configured, the formation of a deposited film was conducted while varying the magnetic flux density in the vicinity of the RF electrode in the plasma generation chamber 101 by adjusting the magnetic field generation means 212.

The apparatus shown in FIG. 2 is of the same constitution of the apparatus shown in FIG. 1(A), except that the former is provided with the foregoing magnetic field generation means 212. As the magnetic field generation means 212, there was used a permanent magnet in this experiment. The permanent magnet was constituted by a plurality of cylindrical permanent magnets (commercially available under the trademark name: NEOMAX 40, produced by Sumitomo Special Metals Co., Ltd.). The magnetic flux density was controlled by adjusting the number of those permanent magnets arranged at the periphery of the RF electrode 108. The measurement of the magnetic flux density was conducted using a magnetic flux density measuring device (trademark name: Gauss Meter Model MG-20R, produced by Magnetic Corporation).

As well as in the case of Experiment 1, there were provided a plurality of p-type single crystalline silicon plates (crystal plane: (100), resistivity: 10 Ω.cm) as the substrate 105. On each of the silicon plates, there was formed a silicon nitride film of 0.5 um in thickness. In each case, the gas introduction position adjusting guide member 111 was fixed at the position A (that is, the gas introduction position adjusting guide member 111 is extended to a position situated at the center of the electrode 108 in the plasma generation chamber).

In each case, the formation of the silicon nitride film was conducted in the following manner. That is, in each case, the number of the permanent magnets constituting the magnetic field generation means 212 was firstly adjusted so that a magnetic flux density in the range of from 120 to 1200 Gauss is provided in the plasma generation chamber 101. The silicon plate as the substrate 105 was placed on the substrate holder 102. The plasma generation chamber 101 and the deposition chamber 104 were evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a vacuum of 0.1 Torr by adjusting the conductance valve (not shown) provided at the exhaust system 104'. Successively, the RF power source 107 was switched on to apply a RF power of 500 W (13.56 MHz) into plasma generation chamber 101 through the electrode 108, whereby plasma was generated in the plasma generation chamber 101, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 0.5 μm on the silicon substrate 105.

The above procedures of forming a silicon nitride film were repeated several times, except that the magnetic flux density in the plasma generation chamber 101 was maintained at a different value in the range of from 120 to 1200 Gauss in each case, to thereby obtain a plurality of silicon nitride film samples. Upon forming each of the silicon nitride film samples, the electron density of plasma in the vicinity of the electrode in the plasma generation chamber 101 was observed in the same manner as in Experiment 1. In addition, each of the resultant silicon nitride film samples Was evaluated in the same manner as in Experiment 1. As a result, it was found that the electron density of plasma is maximum in the vicinity of the RF electrode 108 and thereafter as being distant from the maximum point, it drastically reduces, wherein a doughnut-like electron density distribution state is provided. It was also found that the electron density of plasma in the vicinity of the RF electrode greatly depends upon the magnetic flux density and it exhibits a great value of more than $10^{11}$ cm$^{-3}$ at a magnetic flux density in the range of from 600 to 800 Gauss, wherein the value is maximum at a magnetic flux density of 700 Gauss, and it is lowered at each of the opposite values of magnetic flux density. In addition, as a result of examining the plasma confinement degree (that is, Nee/Nes) in the same manner as in Experiment 1, it was found to be more than 100 in the above range of the magnetic flux density.

Observation was made of the relationship between the film deposition rate and the magnetic flux density. As a result, there were obtained findings that the film deposition rate greatly depends upon the magnetic flux density; a high film deposition rate of 300 nm/min or more can be attained at a magnetic flux density in the range of from 500 to 1000 Gauss; and thus, the film deposition rate is correlated with the magnetic flux density dependency of the electron density of plasma. Further, each of the resultant film samples was evaluated with respect to leakage current. As a result, it was found that the leakage current of a deposited film obtained greatly depends upon the magnetic flux density, and the leakage current of the film is a greatly reduced value of less than $10^{-10}$ A/cm$^2$ when the film is formed at a magnetic flux density in the range of from 500 to 1000 Gauss. Further in addition, each of the resultant film samples was evaluated with respect to electric resistivity, withstand voltage and defect density. As a result, it was found that there can be obtained a high quality silicon nitride film satisfactory with respect to each of these evaluation items at a magnetic flux density in the above range.

From the results obtained in this Experiment 2, the following three findings were obtained. That is, (i) the electron density of plasma and the distribution thereof can be controlled as desired by adjusting the magnetic flux density in the vicinity of the electrode in the plasma generation chamber 101; (ii) the deposition rate, leakage current, electric resistivity, withstand voltage and defect density of a deposited film obtained can be properly controlled by adjusting the magnetic flux density in the vicinity of the electrode in the plasma generation chamber; and (iii) in the case where film formation is conducted while adjusting the magnetic flux density in the vicinity of the electrode in the plasma generation chamber in the range of from 500 to 1000 Gauss, plasma generated is effectively confined wherein a plasma confinement degree of more than 100 is attained, whereby a deposited film of a high quality in terms of leakage current, electric resistivity, withstand voltage and defect density can be formed at a high deposition rate.

As for the reason why a maximum deposition rate as for a deposited film formed is attained when the magnetic flux density is in the range of from 500 to 1000 Gauss and the resulting deposited film formed therein is excellent in terms of leakage current, electric resistivity, withstand voltage and defect density, it is considered that plasma generated is extremely efficiently confined in the vicinity of the electrode in the plasma generation chamber 101 wherein the plasma is in a highly dense state and wherein the plasma is prevented from diffusing near the substrate 105 and the nitrogen gas is efficiently excited and decomposed, and as a result, a deposited film with an improved property especially in view of leakage current is formed at an improved deposition rate without suffering from ion bombardment.

Experiment 3

In this experiment, there were prepared five different deposited film samples by repeating the procedures of Experiment 2 for providing a doughnut-like shaped plasma region comprising plasma localized at a high density, except that the position for the plasma generating raw material gas to be introduced into the plasma generation chamber 101 was changed to one of the five positions employed in Experiment 1 in each case.

Each of the deposited film samples obtained was evaluated in the same manner as in Experiment 1.

In this experiment, there was used the film-forming apparatus shown in FIG. 2 as well as in the case of Experiment 2. The permanent magnets were arranged at the periphery of the RF electrode 108 such that the magnetic flux density in the vicinity of the electrode in the plasma generation chamber 101 became 700 Gauss, with which such a maximum electron density as found in Experiment 2 is to be provided.

In this experiment, there were provided a plurality of p-type single crystalline silicon plates (crystal plane (100), resistivity: 10 Ω.cm) as the substrate 105. On each of the silicon plates, there was formed a silicon nitride film. The formation of the silicon nitride film in each case was conducted in the following manner. That is, the silicon plate as the substrate 105 was placed on the substrate holder 102. The plasma generation chamber 101 and the deposition chamber 104 were evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a vacuum of 0.1 Torr by adjusting the conductance valve (not shown) provided at the exhaust system 104'. Successively, the RF power source 107 was switched on to apply a RF power of 500 W (13.56 MHz) into plasma generation chamber 101 through the electrode 108, whereby plasma was generated while forming a doughnut-like shaped plasma region comprising plasma localized at a high density in the plasma generation chamber 101, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 0.5 μm on the silicon substrate 105.

In the above film formation in each case, the position for the plasma generating raw material gas to be introduced was changed one of the five different positions as well as in the case of Experiment 1, wherein those positions were the position A in which the gas introduction position adjusting guide member 111 is extended to a position situated at the center of the RF electrode 108 in the plasma generation chamber, the position E in which the gas introduction position adjusting guide member 111 is most shrank in the direction toward the top cover member 110 of the plasma generation chamber 101, and the positions B, C, and D respectively corresponding to a position in which the distance between the position A and the position E is divided into three at an equal interval. Thus, there were obtained five silicon nitride film samples. As for each of the five film formations, evaluation was made in the same manner as in Experiment 1.

As a result, it was found that the deposition rate upon film formation greatly depends upon the position through which the plasma generating raw material gas is introduced into the plasma generation chamber 101; a maximum film deposition rate is provided when the plasma generating raw material gas is introduced through the position A (the position in which the gas introduction position adjusting guide member 111 is extended to a position situated at the center of the electrode 108 in the plasma generation chamber); and the film deposition rate has a correlated relationship with the electron density of plasma at a position through which the plasma generating raw material gas is introduced into the plasma generation chamber 101. It was also found that there is no substantial difference among the deposited film samples obtained in terms of leakage current, electric resistivity, withstand voltage and defect density and these factors of a deposited film obtained are, therefore, not liable to depend upon changes in the position through which the plasma generating raw material gas is introduced into the plasma generation chamber 101.

From the results obtained in this Experiment 3, the following three findings were obtained. That is, (i) the efficiency of exciting the plasma generating raw material gas and the deposition rate of a deposited film formed can be controlled as desired in the case of conducting film formation while forming a doughnut-like shaped plasma region comprising plasma localized at a high density and while adjusting the position through which the plasma generating raw material gas is introduced into the plasma generation chamber 101; (ii) in the case of conducting film formation while forming a doughnut-like shaped plasma region comprising plasma localized at a high density and while adjusting the position through which the plasma generating raw material gas is introduced into the plasma generation chamber 101, there is obtained a high quality deposited film for which a leakage current is hardly detected; and (iii) in the case of conducting film formation while introducing the plasma generating raw material gas into the plasma generation chamber through the position in which the gas introduction position adjusting guide member 111 is extended to a position situated at the center of the electrode 108 and while confining plasma in a doughnut-like shaped state with a high density in the vicinity of the electrode in the plasma generation chamber, a deposited film is formed at a maximum deposition rate, and the deposition rate of a deposited film formed has a correlated relationship with the electron density distribution of plasma.

As for the reason why the deposition rate of a deposited film formed is varied in the case of conducting film formation while forming a doughnut-like shaped plasma region comprising plasma localized at a high density and while adjusting the position through which the plasma generating raw material gas is introduced into the plasma generation chamber 101 and the resulting deposited film is of such a high quality that a leakage current is hardly detected, it is considered as follows. That is, distribution is occurred as for the electron density of plasma depending upon changes in the position through which nitrogen gas as the plasma generating raw material gas is to be introduced into the plasma generation chamber 101, and along with this, the efficiency for the nitrogen gas to be excited is changed, resulting in changing the deposition rate of a deposited film formed; ion bombardment to the deposited film formed has no dependency upon the position through which the plasma generating raw material gas to be introduced into the plasma generation chamber 101, and because of this, there is no substantial difference among the deposited films obtained in terms of leakage current, electric resistivity, withstand voltage and defect density.

Experiment 4

In this experiment, film formation was conducted while changing the position for the reactive gas such as monosilane gas to be introduced into the deposition chamber 104, to thereby obtain a plurality of deposited film samples, in the viewpoint of preventing film deposition on the inner wall face of the plasma generation chamber 101 which will be caused due to diffusion of the reactive gas into the plasma generation chamber. As for each film formation, evaluation was made with respect to film deposition rate and film qualities such as leakage current as for the deposited film sample obtained, and film deposition on the inner wall face of the plasma generation chamber 101 during the film formation.

In this experiment, there was used the film-forming apparatus shown in FIG. 2 as well as in the case of Experiment 2. The permanent magnets were arranged at the periphery of the RF electrode 108 such that the magnetic flux density in the vicinity of the electrode in the plasma generation chamber 101 became 700 Gauss, with which such a maximum electron density as found in Experiment 2 is to be provided. And the gas introduction position adjusting guide member 111 was fixed at the position A (that is, the gas introduction position adjusting guide member 111 is extended to a position situated at the center of the electrode 108 in the plasma generation chamber), which was described in Experiment 1. The film-forming procedures of Experiment 2 were repeated, except that in each case, the position for monosilane gas as the reactive gas to be introduced into the deposition chamber through the gas feed means 106 was changed to one of five different positions, i.e., position a in which the outlet of the gas feed means 106 is situated at the same level as the surface of the substrate, position e in which the outlet of the gas feed means 106 is situated at a position in the vicinity of the boundary between the plasma generation chamber 101 and the film-forming chamber 104, and positions b, c, and d respectively corresponding to a position in which the distance between the position a and the position e is divided into three at an equal interval.

In this experiment, there were provided a plurality of p-type single crystalline silicon plates (crystal plane (100), resistivity: 10 Ω.cm) as the substrate 105. On each of the silicon plates, there was formed a silicon nitride film. In each case, the formation of the silicon nitride film was conducted in the following manner. The silicon plate as the substrate 105 was firstly placed on the substrate holder 102. The plasma generation chamber 101 and the deposition chamber 104 were then evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106, which was fixed at one of the foregoing five positions, into the deposition chamber 104 at a flow rate of 50 sccm. Then, the inner pressure of each of the plasma generation chamber 101 and the deposition chamber 104 was maintained at a vacuum of 0.1 Torr by adjusting the conductance valve (not shown) provided at the exhaust system 104'. Successively, the RF power source 107 was switched on to apply a RF power of 500 W (13.56 MHz) into plasma generation chamber 101 through the electrode 108, whereby plasma was generated while forming a doughnut-like shaped plasma region comprising plasma localized at a high density in the plasma generation chamber 101, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 0.5 μm on the silicon substrate 105 in the deposition chamber. In this way, there were obtained five silicon nitride film samples. As for each of the film samples obtained, evaluation was conducted in the same manner as in Experiment 1. As for the situation of film deposition on the inner wall face of the plasma generation chamber 101 in each case, it was evaluated in a manner that a single crystalline silicon plate is disposed on the inner wall face of the plasma generation chamber in the vicinity of the electrode, and the thickness of a film deposited on the silicon plate is measured after the film formation has been completed.

As a result, it was found that the deposition rate of a deposited film has a dependency upon changes in the position for the reactive gas to be introduced; a maximum film deposition rate is provided in the case where the outlet of the gas feed means 106 is situated at the position c; and a reduced film deposition rate is provided at both sides opposite the position c. It was also found that there is no substantial difference among the deposited film samples obtained in terms of film qualities such as leakage current and the factors relating to the film qualities are, therefore, not liable to depend upon changes in the position for the reactive gas to be introduced into the deposition chamber 104. Further, it was found that the amount of a film deposited on the inner wall face of the plasma generation chamber 101 is greater as the closer to the plasma generation chamber 101, that is, to the position e, the outlet of the gas feed means 106 is; and it is negligible in the range between the position a and the position c.

From the results obtained in this Experiment 4, the following two findings were obtained. That is, (i) the deposition rate of a deposited film obtained can be controlled as desired by adjusting the position for the reactive gas to be introduced into the deposition chamber 104 wherein a optimum position is present; and (ii) the amount of a film deposited on the inner wall face of the plasma generation chamber 101 can be controlled as desired by adjusting the position for the reactive gas to be introduced into the deposition chamber 104, and it is possible to minimize said film deposition to a negligible degree by optimizing the position for the reactive gas to be introduced.

As for the reason why the deposition rate of a deposited film formed can be optimized and the amount of a film deposited on the inner wall face of the plasma generation chamber 101 can be minimized by adjusting the position for the reactive gas to be introduced into the deposition chamber 104, it is considered to be due to that in the case where the position for the reactive gas to be introduced into the deposition chamber 104 is situated at a position close to the plasma generation chamber 101 (that is, in the case of the position e), the reactive gas is likely to diffuse into the plasma generation chamber 101, resulting in causing film deposition on the inner wall face of the plasma generation chamber wherein the amount of a film deposited on the substrate is decreased; and on the other hand, in the case where the position for the reactive gas to be introduced into the deposition chamber 104 is distant from the plasma generation chamber 101 (that is, in the case of the position a), the reactive gas is hardly diffused into the plasma generation chamber 101 and because of this, deposition of a film on the inner wall face of the plasma generation chamber 101 is slightly occurred but in contrast with this, the occasion for the reactive gas to be chemically reacted with the active species of the nitrogen gas as the plasma generating raw material gas is decreased, resulting in increasing the amount of the reactive gas to be exhausted without contributing to the formation of a deposited film on the substrate.

Experiment 5

This experiment was conducted aiming at finding out film-forming conditions which make it possible to provide an improved film deposition efficiency. In this experiment, film formation was conducted by employing the optimum position for the plasma generating raw material gas to be introduced, the optimum magnetic flux density, and the optimum position for the reactive gas to be introduced, which were found out in Experiments 1 to 4, and while changing the inner pressure (P) and the electrode-substrate distance (D) to those shown in Tables 1 and 2, to thereby obtain a plurality of deposited film samples. As for the deposited film sample obtained in each film formation, evaluation was conducted in the same manner as in Experiment 1.

In this experiment, there was used the film-forming apparatus shown in FIG. 2 as well as in the case of Experiment 2. The permanent magnets were arranged at the periphery of the RF electrode 108 such that the magnetic flux density in the vicinity of the electrode in the plasma generation chamber 101 became 700 Gauss, with which such a maximum electron density as found in Experiment 2 is to be provided. And the gas introduction position adjusting guide member 111 was fixed at the position A (that is, the gas introduction position adjusting guide member 111 is extended to a position situated at the center of the electrode 108 in the plasma generation chamber), which was described in Experiment 1. Further as for the position for the reactive gas, i.e., monosilane gas to be introduced into the deposition chamber, the outlet of the gas feed means 106 was fixed at the position c described in Experiment 4.

In this experiment, there were provided a plurality of p-type single crystalline silicon plates (crystal plane (100), resistivity: 10 $\Omega$.cm) as the substrate 105. On each of the silicon plates, there was formed a silicon nitride film. The formation of the silicon nitride film in each case was conducted in the following manner. That is, the silicon plate as the substrate 105 was placed on the substrate holder 102. The substrate holder 102 was moved to provide a different distance of 5 to 50 cm between the substrate 105 and the electrode 108 (see, Tables 1 and 2) in each case. The plasma generation chamber 101 and the deposition chamber 104 were evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a different vacuum of 0.01 to 0.5 Torr by adjusting the conductance valve (not shown) provided at the exhaust system 104' (see, Tables 1 and 2) in each case. Successively, the RF power source 107 was switched on to apply a RF power of 500 W (13.56 MHz) into plasma generation chamber 101 through the electrode 108, whereby plasma was generated while forming a doughnut-like shaped plasma region comprising plasma localized at a high density in the plasma generation chamber 101, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 0.5 μm on the silicon substrate 105 in the deposition chamber. In this way, there were obtained a plurality of silicon nitride film samples. As for each film formation, evaluation was made in the same manner as in Experiment 1.

The evaluated results with regard to film deposition rate and film quality including leakage current were categorized based on the four criteria shown in Tables 1 and 2 in relation to the inner pressure (p) and the electrode-substrate distance (D). The results obtained are shown in Tables 1 and 2. Table 1 illustrates the evaluated results with respect to film deposition rate. Table 2 illustrates the evaluated results with respect to leakage current.

From the results shown in Tables 1 and 2, the following findings were obtained. That is, in general, the smaller the electrode-substrate distance (D), the greater the film deposition rate; in the case where the electrode-substrate distance (D) is relatively small, the film deposition rate increases as the inner pressure heightens; in the case where the electrode-substrate distance (D) is relatively large, a maximum film deposition rate is provided upon changing the inner pressure (P); in order to obtain a satisfactory film deposition rate, it is necessary to satisfy at least the conditions that the inner pressure is 0.02 Torr or more and the product (that is, P×D product) of the inner pressure (P) and the electrode-substrate distance (D) is less than 5; a high quality deposited film for which no leakage current is detected can be obtained in the case where the inner pressure (P) is relatively high and the electrode-substrate distance (D) is relatively large; and in order to obtain such a deposited film that is sufficiently small in leakage current, it is necessary for the P×D product to be 0.5 or more.

On the basis of the above findings in Experiment 5, the following three knowledges were obtained. That is, (i) in the case where the electrode-substrate distance (D) is relatively small, the film deposition rate increases as the inner pressure (P) heightens, and in the case where the electrode-substrate distance (D) is relatively large, a maximum film deposition rate is provided upon changing the inner pressure (P); (ii) a high quality deposited film for which no leakage current is detected can be obtained in the case where the inner pressure (P) is relatively high and the electrode-substrate distance (D) is relatively large; and (iii) in order to obtain such a deposited film that is sufficiently small in leakage current, it is necessary for the product (that is, P×D product) of the inner pressure (P) and the electrode-substrate distance (D) to be in the range of from 0.5 to 5.0.

As for the reason why the film deposition rate increases as the inner pressure (P) heightens in the case where the electrode-substrate distance (D) is relatively small, and a maximum film deposition rate is provided upon changing the inner pressure (P) in the case where the electrode-substrate distance (D) is relatively large, it is considered to be due to that in the case where the inner pressure is relatively high, the residence time of the gaseous materials in the film-forming chamber 104 is relatively long and because of this, the probability for the gaseous materials to be contacted and chemically reacted with each other is high, resulting in providing a high deposition rate for a deposited film formed, however in the case where the electrode-substrate distance (D) is relatively large, when the inner pressure (P) is excessively high, the active species of the plasma generating raw material gas are not sufficiently transported to a position in the vicinity of the substrate.

As for the reason why a high quality deposited film for which no leakage current is detected can be obtained in the case where the inner pressure (P) is relatively high and the electrode-substrate distance (D) is relatively large, it is considered to be due to that the substrate is isolated from plasma wherein ion bombardment is slightly occurred in that case.

The findings obtained in Experiments 1 to 5 can be summarized as follows. That is, a desirable deposited film of dense texture and accompanied by few defects and which is substantially free of leakage current or for which a leakage current is slight to such an extent that it is hardly detected can be formed at a markedly high deposition rate when film formation is conducted by producing plasma using a RF electrode; applying a magnetic field to provide a magnetic flux density with a maximum intensity in the range of from 500 to 1000 Gauss by means of a magnetic field generation means to localize said plasma whereby forming a doughnut-like shaped plasma region comprising plasma localized at a high density; supplying a plasma generating raw material gas through a gas feed means into the doughnut-like shaped high density plasma region, wherein a plasma confinement degree (Nee/Nes) which is expressed by a ratio between an electron density (Nes) in the vicinity of a substrate for film formation which is arranged so as to isolate from the doughnut-like shaped high density plasma region and an electron density (Nee) in the vicinity of the RF electrode is adjusted to be 100 or more, and a product (that is, a P×D product) of a distance (D) between the RF electrode and the substrate and an inner pressure (P) in a film-forming space is adjusted to satisfy the equation $0.5 \leq P \times D \leq 5.0$.

From the results obtained in Experiments 1 to 5, there was obtained a finding which will be described in the following. That is, a desirable functional deposited film of tense texture, which is substantially free of leakage current or for which a leakage current is slight to such an extent that it is hardly detected, can be formed at a markedly high deposition rate when film formation is conducted by causing a magnetic field in a plasma generation chamber by means of a magnetic field generation means such that said magnetic field is in parallel to said magnetic field generation means and that a magnetic flux density with a maximum intensity in the range of from 500 to 1000 Gauss is provided; introducing a plasma generating raw material gas therein and simultaneously, applying a RF power through a RF electrode therein to produce plasma in a state that said plasma is localized in a doughnut-like shape with a high density, whereby forming a doughnut-like shaped plasma region while producing active species of said plasma generating raw material gas; introducing a film-forming raw material gas reactive with said active species into a deposition chamber having a substrate on which a film is to be formed arranged therein, wherein a ratio of Nee/Nes which is expressed by a ratio between an electron density (Nes) in the vicinity of the substrate and an electron density (Nee) in the vicinity of the RF electrode is adjusted to be 100 or more, and the relationship between a distance (D) between the RF electrode and the substrate and an inner pressure (P) in the deposition chamber is adjusted to satisfy the equation $0.5 \leq P \times D \leq 5.0$.

DESCRIPTION OF THE PREFERRED EMBODIMENTS

The present invention is to provide a process for forming a functional deposited film by way of RF plasma CVD method wherein plasma is generated in a substantially enclosed plasma generation chamber provided with a RF electrode at the periphery of said plasma generation chamber by applying a RF power into said plasma generation chamber through said RF electrode and a functional deposited film is formed on a substrate for film formation arranged in a deposition chamber which is communicated with said plasma generation chamber such that said substrate is isolated from a zone where the plasma is generated in said plasma generation chamber, characterized by comprising forming a magnetic field with a maximum intensity of 500 to 1000 Gauss in terms of magnetic flux density by means of a magnetic field generation means such that said magnetic field resides on the inner wall face side of and in parallel to the circumferential wall of said plasma generation chamber; supplying a plasma generating raw material gas into a zone where said magnetic field residues through a plasma generating raw material gas feed means, and applying a RF power through said RF electrode into said plasma generation chamber, whereby exciting and decomposing said plasma generating raw material gas to form a high density plasma region comprising doughnut-like localized plasma wherein active species of said plasma generating raw material gas are produced; introducing a film-forming raw material gas, which is chemically reactive with said active species, into deposition chamber wherein said film-forming raw material gas is chemically reacted with said active species, wherein a ratio of Nee/Nes between an electron density Nes in the vicinity of the substrate and an electron density Nee in the vicinity of the RF electrode is adjusted to be 100 or more and the relationship between a distance D between the RF electrode and the substrate and an inner pressure P of the deposition chamber is adjusted to satisfy the equation $0.5 \leq p \times D \leq 5.0$, whereby causing the formation of a functional deposited film on the substrate.

As for the high frequency used in the present invention, there can be illustrated such a high frequency with 13.56 MHz as used in the foregoing experiments as a representative example. However, it is possible to use a high frequency with a frequency of 1 to 300 MHz in the present invention. As for the RF electrode, there can be illustrated such a ring-like shaped electrode of a capacitive-coupled type as used in the foregoing experiments as a representative example. However, it is also possible use RF electrodes of other shapes such as pole-like shape, and inductively coupled coils.

As the magnetic field generating means used in the present invention which is capable of effectively accelerating electron by virtue of E (electric field)×B (magnetic field) drift, there can be used any magnetic field generating means as long as they can generate a magnetic field perpendicular (which is in parallel to the circumferential wall of the plasma generation chamber) to the electric field in the vicinity of the RF electrode (which is perpendicular to the circumferential wall of the plasma generation chamber). Specifically, there can be illustrate, other than the permanent magnet used in the foregoing experiments, electromagnets. In the foregoing experiments, there was employed cylindrical magnetron field. In the present invention, other than this, it can employ mirror field, cylindrical cusp field, multicusp field, and double cylindrical magnetron field as long as they can establish a magnetic circuit capable of causing a E×B drift. However, in the viewpoint that the zone wherein a E×B drift is caused is effective for confining plasma when it is narrowed, the single cylindrical magnetron field is the most appropriate.

The control of the magnetic flux density in the present invention can be conducted in such a manner as employed in the foregoing experiments wherein a plurality of permanent magnets are properly arranged. Other than this, it can be conducted by adjusting polarized densities of those magnets or by adjusting the distance between the inner wall face of the plasma generation chamber and those magnets.

The gas feed means capable of supplying a plasma generating raw material gas in the present invention may be of any kind as long as it has an outlet to be contact with high frequency plasma in the plasma generation chamber. Specific examples are ring-like shaped gas feed pipes, and coaxial multiple pipes.

The control of the P×D product with regard to the inner pressure P of the deposition chamber and the distance D between the substrate and the RF electrode upon film formation in the present invention can be properly conducted by adjusting the distance between the RF electrode and the substrate and adjusting the inner pressure of the deposition chamber in the manner described in the foregoing experiments. The inner pressure of the deposition chamber upon film formation is desired to be in the range of from 0.05 to 0.2 Torr. As for the distance between the substrate and the RF electrode, it is desired to be in the range of from 10 to 20 cm.

In the present invention, it is possible to conduct film formation while irradiating light to the surface of the substrate in order to facilitate the surface reaction at the substrate surface. As the light to be irradiated in this case, there can be illustrated visible light, ultraviolet ray, and the like.

As for the temperature of the substrate upon forming a deposited film on the substrate according to the film-forming process of the present invention, it is somewhat different depending upon the kind of a film-forming raw material gas used, and the kind and application use of a deposited film to be formed. However, in general, it is preferably in the range of from 50° to 600° C., most preferably in the range of from 150° to 400° C.

According to the film-forming process of the present invention, it is possible to effectively form various kinds of deposited films using selected appropriate raw material gases. Those deposited films are, for example, insulating films of $Si_3N_4$, $SiO_2$, $Ta_2O_5$, $TiO_2$, TiN, $Al_2O_3$, AlN, and $MgF_2$; semiconductor films of a-Si, poly-Si, SiC, and GaAs; and metallic films of Al, W, Mo, Ti, and Ta.

The plasma treating technique employed in the present invention may be applied also in the surface modification of an article. Particularly, oxidation treatment or nitriding treatment of a substrate or a surface layer comprising Si, Al, Ti, Zn, or Ta can be conducted by using an appropriate raw material gas. It is also possible to conduct doping treatment with the use of B, As or P.

The plasma treating technique employed in the present invention may be applied also in the cleaning treatment of an article. Particularly, it is possible to conduct the cleaning treatment of oxide members, organic members, and heavy metal members.

The technical constitution in the case where the plasma treating technique of the present invention is employed in the above surface modification or the above cleaning treatment is as will be under described.

That is, a process for treating a surface of a substrate by way of RF plasma CVD process wherein plasma is generated in a substantially enclosed plasma generation chamber provided with a RF electrode at the periphery of said plasma generation chamber by applying a RF power into said plasma generation chamber through said RF electrode whereby producing active species, said active species are transported to a deposition chamber in communication with said plasma generation chamber, wherein the surface of a substrate arranged in said deposition chamber such that said substrate is isolated from the plasma generation zone is treated with said active species. The gist of this process comprises forming a magnetic field with a maximum intensity of 500 to 1000 Gauss in terms of magnetic flux density by means of a magnetic field generation means such that said magnetic field resides on the inner wall face side of and in parallel to the circumferential wall of the plasma generation chamber; supplying a plasma generating raw material gas into a zone where said magnetic field residues through a plasma generating raw material gas feed means, and applying a RF power through the RF electrode into the plasma generation chamber, whereby exciting and decomposing said plasma generating raw material gas to form a high density plasma region comprising doughnut-like localized plasma wherein active species of said plasma generating raw material gas are produced; transporting said active species into the deposition chamber wherein the surface of the substrate is treated with the active species, wherein a ratio of Nee/Nes between an electron density Nes in the vicinity of the substrate and an electron density Nee in the vicinity of the RF electrode is adjusted to be 100 or more and the relationship between a distance D between the RF electrode and the substrate and an inner pressure P of the deposition chamber is adjusted to satisfy the equation $0.5 \leq p \times D \leq 5.0$.

The substrate to be used for forming a deposited film thereon according to the film-forming process of the present invention can include semiconductor substrates, electroconductive substrates, and insulating substrates.

Specific examples of the semiconductor substrate are wafer-like shaped members obtained by slicing a block of Si, Ge, C, GaSb, InAs, InSb, or GaP into a wafer-like shape, and members comprising said wafer-like shaped members applied with the same kind or different kind films to their surface.

Specific examples of the electroconductive substrate are metal members of metals such as Fe, Ni, Cr, Al, Mo, Au, Nb, Ta, V, Ti, Pt, and Pb; and alloy members of alloys of these metals, e.g., brass, stainless steel, and the like.

Specific examples of the insulating substrate are members of various glasses, such as $SiO_2$ series quartz glasses; members of inorganic materials such as $Si_3N_4$, NaCl, KCl, LiF, $CaF_2$, $BaF_2$, $Al_2O_3$, AlN, and MgO; and films, sheets, and blocks of organic materials such as polyethylene, polyester, polycarbonate, cellulose acetate, polypropylene, polyvinyl chloride, polyvinylidene chloride, polystylene, polyamide, and polyimide.

As the film-forming raw material gas used in the present invention, any of known film-forming raw material gases can be used. In the case of using a film-forming raw material gas which can be easily decomposed with the action of plasma to cause the formation of a film even when it is solely used, such film-forming raw material gas is desired to be introduced into the deposition chamber through the gas feed means 106 situated in the vicinity of the substrate, not only for the purpose of attaining desired stoichiometric composition for a deposited film formed but also for the purpose of preventing film deposition on the inner wall face of the plasma generation chamber. In the case of using a film-forming raw material gas which cannot be easily decomposed with the action of plasma and which cannot cause the formation of a film when it is solely used, such film-forming raw material gas is desired to be introduced into the plasma generation chamber through the gas feed pipe 109 situated in the vicinity of the RF electrode.

Specifically, as the Si-containing film-forming raw material gas which is used for the formation of a Si-containing semiconductor film such as a-Si semiconductor films, poly-Si semiconductor films, and SiC semiconductor film and which is introduced through the gas feed means 106, there can be illustrated inorganic silanes such as $SiH_4$, $Si_2H_6$, and the like; organic silanes such as tetraethylsilane (TES), tetramethylsilane (TMS), dimethylsilane (DMS), and the like; and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, $SiCl_2F_2$, and the like, which are in gaseous state at room temperature and at normal pressure or can be easily gasified. As the plasma generating raw material gas which is introduced through the gas feed pipe 109 in this case, there can be illustrated $H_2$, He, Ne, Ar, Kr, Xe, and Rn.

Similarly, as the Si-containing film-forming raw material gas which is used for the formation of a Si-containing compound film such as $Si_3N_4$ film and $SiO_2$ film and which is introduced through the gas feed means 106, there can be illustrated inorganic silanes such as $SiH_4$, $Si_2H_6$, and the like; organic silanes such as tetraethoxysilane (TEOS), tetramethoxysilane (TMOS), octamethylcyclotetrasilane (OMCTS), and the like; and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, $SiCl_2F_2$, and the like, which are in gaseous state at room temperature and at normal pressure or can be easily gasified. As the plasma generating raw material gas which is introduced through the gas feed pipe 109 in this case, there can be illustrated $N_2$, $NH_3$, $N_2H_4$, hexamethyldisilane (HMDS), $O_2$, $O_3$, $H_2O$, NO, $N_2O$, $NO_2$, and the like.

As the metal atom-containing film-forming raw material gas which is used for the formation of a metal film of Al, W, Mo, Ti, or Ta and which is introduced through the gas feed means 106, there can be illustrated organic metal compounds such as trimethylaluminum (TMAl), triethylaluminum (TEAl), triisobutylaluminum (TIBAl), dimethylaluminum hydride (DMAlH), tungsten carbonyl ($W(CO)_6$), molybdenum carbonyl ($Mo(CO)_6$), trimethylgallium (TMGa), triethylgallium (TEGa), and the like; and metal halogenides such as $AlCl_3$, $WF_6$, $TiCl_3$, $TaCl_5$, and the like. As the plasma generating raw material gas which is introduced through the gas feed pipe 109 in this case, there can be illustrated $H_2$, He, Ne, Ar, Kr, Xe, and Rn.

As the metal atom-containing film-forming raw material gas which is used for the formation of a metal compound film of $Al_2O_3$, AlN, $Ta_2O_5$, $TiO_2$, TiN, or $WO_3$ and which is introduced through the gas feed means 106, there can be illustrated organic metal compounds such as trimethylaluminum (TMAl), triethylaluminum (TEAl), triisobutylaluminum (TIBAl), dimethylaluminum hydride (DMAlH), tungsten carbonyl ($W(CO)_6$), molybdenum carbonyl ($Mo(CO)_6$), trimethylgallium (TMGa), triethylgallium (TEGa), and the like; and metal halogenides such as $AlCl_3$, $WF_5$, $TlCl_3$, $TaCl_5$, and the like. As the plasma generating raw material gas which is introduced through the gas feed pipe 109 in this case, there can be illustrated $O_2$, $O_3$, $H_2O$, NO, $N_2O$, $NO_2$, $N_2$, $NH_3$, $N_2H_4$, hexamethyldisilane (HMDS), and the like.

In the case of subjecting the surface of a substrate to the foregoing surface oxidation treatment in the present invention, an appropriate oxidizing gas is introduced through the gas feed pipe 109. Specific examples of such oxidizing gas are $O_2$, $O_3$, $H_2O$, NO, $N_2O$, and $NO_2$. In the case of subjecting the surface of a substrate to the foregoing surface nitriding treatment in the present invention, an appropriate nitriding gas is introduced through the gas feed pipe 109. Specific examples of such nitriding gas are $N_2$, $NH_3$, $N_2H_4$, and hexamethyldisilazane (HMDS). In any of these two cases, no gas is introduced through the gas feed means 106 since film formation is not conducted. However, it is possible to introduce the same treating gas, which is introduced through the gas feed pipe 109, also through the gas feed means 106.

In the case of subjecting the surface of a substrate to the foregoing cleaning treatment in order to remove foreign matters present at the substrate surface in the present invention, an appropriate cleaning gas is introduced through the gas feed pipe 109. Specific examples of such cleaning gas are $F_2$, $CF_4$, $CH_2F_2$, $C_2F_6$, $CF_2Cl_2$, $SF_6$, and $NF_3$. In this case, no gas is introduced through the gas feed means 106 since film formation is not conducted. However, it is possible to introduce the same cleaning gas, which is introduced through the gas feed pipe 109, also through the gas feed means 106.

The process for forming a functional deposited film by way of RF plasma CVD process according to the present invention may be practiced using an appropriate plasma CVD apparatus which comprises a substantially enclosed plasma generation chamber provided with an electrode capable of applying a RF power and a magnetic field generation means at the exterior thereof and a deposition chamber in communication with said plasma generation chamber, said deposition chamber containing a substrate on which a film is to be formed therein, said substrate being arranged such that it is isolated from a plasma region formed in said plasma generation chamber, said plasma generation chamber being capable of localize plasma generated in a doughnut-like shaped state in the vicinity of said electrode, and said plasma generation chamber being provided with a gas feed means such that the outlet of said gas feed means contacts with said localized plasma region.

As a typical example of such plasma CVD apparatus which enables to practice the process for forming a functional deposited film by way of RF plasma CVD process according to the present invention, there can be mentioned the apparatus shown in FIG. 2, described in the foregoing experiments. Other than this, there can be mentioned an apparatus comprising the apparatus shown in FIG. 2 appropriately modified through the conventional technique in the technical field to which the present invention pertains.

Explanation will be made of the manner of practicing the present invention by using the apparatus shown in FIG. 2.

The magnetic field generation means 112 arranged at the periphery of the plasma generation chamber 101 is adjusted so that a magnetic flux density of 500 to 1000 Gauss is provided in the vicinity of the RF power applying electrode 108. A substrate 105 on which a deposited film is to be formed is placed in the deposition chamber 104. Then, the inside of the deposition chamber 104 is evacuated to a desired vacuum by means of the exhaust system 104'. The substrate 105 is maintained at desired temperature using the heater 103. Plasma generating raw material gas is introduced into the plasma generation chamber 101 through the gas feed pipe 109 and the gas introduction position adjusting guide member 111 capable of guiding the plasma generating raw material gas to the zone where a high density plasma region is to be formed. Film-forming raw material gas is introduced into the deposition chamber 104 through the ring-like shaped gas feed means provided at the deposition chamber 104. The inside of each of the plasma generation chamber 101 and the deposition chamber 104 is maintained at a predetermined pressure by regulating the conductance valve (not shown) provided at the exhaust system 104'. The pressure herein is adjusted such that the ratio of Nee/Nes between the electron density Nes of plasma in the vicinity of the substrate 105 and the electron density Nee of plasma in the vicinity of the RF power applying electrode 108 becomes 100 or more and the relationship between the distance D between the electrode 108 and the substrate 105 and the inner pressure P of the deposition chamber 104 satisfies the equation $0.5 \leq P \times D \leq 5$. The RF power source 107 is switched on to apply a predetermined electric power into the plasma generation chamber 101 through the electrode 108. By this, plasma is generated in a doughnut-like localized state in the plasma generation chamber 101. Wherein, the plasma generating raw material gas introduced into the plasma generation chamber 101 through the gas feed pipe 109 and the the gas introduction position adjusting guide member 111 is excited and decomposed to produce active species, the active species are successively transported toward the substrate 105, and they are chemically reacted with the film-forming raw material gas introduced through the gas feed means 106, whereby causing the formation of a deposited film on the substrate 105.

EXAMPLES

The process for forming a deposited film according to the present invention will be described in more detail by reference to the following examples, which are provided here for illustrative purposes only, and are not intended to limit the scope of the present invention.

Example 1

There was formed a silicon nitride film usable as a protective layer for a semiconductor element using the film-forming apparatus shown in FIG. 2 as a plasma CVD apparatus.

The magnetic field generation means 212 was constituted by a plurality of permanent magnets (commercially available under the trademark name: NEOMAX 40, produced by Sumitomo Special Metals Co., Ltd.). The number of these permanent magnets arranged at the periphery of the RF electrode 106 was adjusted so that a magnetic flux density of 700 Gauss is provided. The gas introduction position adjusting member 111 was fixed at the position A, described in the foregoing Experiment 1, (that is, the gas introduction position adjusting member 111 is extended to the position situated at the center of the electrode 108). The outlet of the gas feed means 106 serving to supply the reactive gas was fixed at the position c, described in the foregoing Experiment 4.

As the substrate 105, there was used a p-type single crystalline silicon plate (crystal plane: (100), resistivity: 10 $\Omega$.cm). The silicon plate as the substrate 105 was first placed on the substrate holder 102. The plasma generation chamber 101 and the deposition chamber 104 were then evacuated to bring their inside to a vacuum of $10^{-6}$ Torr through the exhaust system 104'. Successively, the silicon substrate 105 was heated to 300° C. by energizing the heater 103, and it was maintained at this temperature. Nitrogen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a vacuum of 0.1 Torr (P×D product =2.0) by adjusting the conductance valve (not shown) provided at the exhaust system 104'. Successively, the RF power source was switched on to apply a RF power of 500 W (13.56 MHz) into plasma generation chamber 101 through the electrode 108, whereby plasma was generated in the plasma generation chamber 101 while forming a doughnut-like shaped plasma region comprising plasma localized at a high density, wherein the nitrogen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon nitride film at a thickness of 1.0 μm on the silicon substrate 105 in the deposition chamber. After the film formation was completed, evaluation was made with respect film deposition rate, film quality including leakage current, and film stress. The evaluation of the film stress was conducted by measuring a change in warp quantity of the substrate between before and after the film formation by means of a laser interferometer (produced by Zygo Company).

As a result, as for the resultant silicon nitride film, it was found that the film deposition rate is extremely great as much as 300 nm/min, and that the film is of $1 \times 10^{-10}$ A/cm$^2$ in leakage current, $2 \times 10^{16}$ Ω.cm in electric resistivity, 8 MV/cm in withstand voltage, and $1 \times 10^9$ dyn in film stress, and because of this, the film markedly excels in quality.

Example 2

There was formed a silicon oxide film usable as a gate insulating layer for a semiconductor element using the film-forming apparatus shown in FIG. 2 as a plasma CVD apparatus.

The magnetic field generation means 212 was constituted by a plurality of permanent magnets (commercially available under the trademark name: NEOMAX 40, produced by Sumitomo Special Metals Co., Ltd.). The number of these permanent magnets arranged at the periphery of the RF electrode 106 was adjusted so that a magnetic flux density of 700 Gauss is provided in the plasma generation chamber 101. The gas introduction position adjusting member 111 was fixed at the position A, described in the foregoing Experiment 1, (that is, the gas introduction position adjusting member 111 is extended to the position situated at the center of the electrode 108). The outlet of the gas feed means 106 serving to supply the reactive gas was fixed at the position c, described in the foregoing Experiment 4.

As the substrate 105, there was used a p-type single crystalline silicon plate (crystal plane: (100), resistivity: 10 Ω.cm). The silicon plate as the substrate 105 was firstly placed on the substrate holder 102. The plasma generation chamber 101 and the deposition chamber 104 were then evacuated to bring their inside to a vacuum of $10^{-6}$ Torr through the exhaust system 104'. Successively, the silicon substrate 105 was heated to 300° C. by energizing the heater 103, and it was maintained at this temperature. Oxygen gas was introduced through the gas feed pipe 109 into the plasma generation chamber 101 at a flow rate of 500 sccm. At the same time, monosilane gas was introduced through the gas feed means 106 into the deposition chamber 104 at a flow rate of 50 sccm. Then, the inner pressure of each of the plasma generation chamber 101 and the deposition chamber 104 was maintained at a vacuum of 0.05 Torr (P×D product =1.0) by adjusting the conductance valve (not shown) provided at the exhaust system 104'. Successively, the RF power source was switched on to apply a RF power of 500 W (13.56 MHz) into plasma generation chamber 101 through the electrode 108, whereby plasma was generated in the plasma generation chamber 101 while forming a doughnut-like shaped plasma region comprising plasma localized at a high density, wherein the oxygen gas introduced through the gas feed pipe 109 was excited and decomposed to produce active species in the plasma generation chamber 101, the active species thus produced were successively transported toward the silicon substrate 105 in the deposition chamber, and they were chemically reacted with the monosilane gas introduced through the gas feed means 106, whereby causing the formation of a silicon oxide film at a thickness of 0.1 μm on the silicon substrate 105 in the deposition chamber. After the film formation completed, evaluation was made with respect film deposition rate, leakage current, electric resistivity, withstand voltage, defect density, and interface state density. The evaluation of the interface state density was conducted on the basis of a C–V curve obtained by applying a RF power of 1 MHz to the film using a capacitance measuring device.

As a result, as for the resultant silicon oxide film, it was found that the film deposition rate is extremely great as much as 450 nm/min, and that the film is of $5 \times 10^{11}$ A/cm$^2$ in leakage current $5 \times 10^{16}$ Ω.cm in electric resistivity, 11 MV/cm in withstand voltage, and $5 \times 10^{10}$ cm$^{-2}$ in interface state density, and because of this, the film markedly excels in quality.

Example 3

The film-forming apparatus according to the present invention was partially modified to be a photoassisted plasma CVD apparatus. Using this apparatus, there was formed a silicon oxide film usable as a dielectric interlayer of a semiconductor element.

The apparatus used is of the constitution shown in FIG. 3. In the apparatus shown in FIG. 3, reference numeral 301 indicates a light source comprising a Xe lamp. Reference numeral 302 indicates an integrator capable of mixing light from the light source 301, wherein the integrator comprises a fly eye lens. Reference numeral 303 indicates a collimator lens capable of irradiating parallel beam of light to the window plate 210 made of quartz glass.

The constitution of the apparatus shown in FIG. 3 is as that of the apparatus shown in FIG. 2, except that the light source 301, the integrator 302, and the collimator 303 are added to the apparatus shown in FIG. 2.

The magnetic field generation means 212 was constituted by a plurality of permanent magnets (commercially available under the trademark name: NEOMAX 40, produced by Sumitomo Special Metals Co., Ltd.). The number of these permanent magnets arranged at the periphery of the RF electrode 106 was adjusted so that a magnetic flux density of 700 Gauss is provided in the plasma generation chamber. The gas introduction position adjusting member 111 was fixed at the position A, described in the foregoing Experiment 1, (that is, the gas introduction position adjusting member 111 is extended to the position situated at the center of the electrode 108). The outlet of the gas feed means 106 serving to supply the reactive gas was fixed at the position c, described in the foregoing Experiment 4.

As the substrate 105, there was used a p-type single crystalline silicon plate (crystal plane: (100), resistivity: 10 Ω.cm). The silicon plate as the substrate 105 was firstly placed on the substrate holder 102. The plasma generation chamber 101 and the deposition chamber 104 were then evacuated to bring their inside to a vacuum of $10^{-6}$ Torr through the exhaust system 104'. Successively, the Xe lamp 301 was energized to irradiate light to the surface of the silicon substrate 105 so that the illumination intensity at the surface of the silicon substrate 105 became 0.6 W/cm$^2$ Simultaneously with this the silicon substrate 105 was heated to 300° C. by energizing the heater 103, and it was maintained at this temperature. Oxygen gas was introduced through the gas feed pipe 109 into the plasma generation chamber 101 at a flow rate of 2000 sccm. At the same time, tetraethoxysilane (TEOS) gas was introduced through the gas feed means 106 into the deposition chamber 104 at a flow rate of 400 sccm. Then, the inner pressure of each of the plasma generation chamber 101 and the deposition chamber 104 was maintained at a vacuum of 0.1 Torr (P×D product =2.0) by adjusting the conductance valve (not shown) provided at the exhaust system 104'. Successively, the RF power source was switched on to apply a RF power of 500 W (13.56 MHz) into plasma generation chamber 101 through the electrode 108, whereby plasma was generated in the plasma generation chamber 101 while forming a doughnut-like shaped plasma region comprising plasma localized at a high density, wherein the oxygen gas introduced through the gas feed pipe 109 was excited and decomposed to produce active species in the plasma generation chamber 101, the active species thus produced were successively transported toward the silicon substrate 105 in the deposition chamber, and they were chemically reacted with the TEOS gas introduced through the gas feed means 106, whereby causing the formation of a silicon oxide film at a thickness of 1.0 μm on the silicon substrate 105. After the film formation completed, evaluation was made with respect film deposition rate, leakage current, electric resistivity, withstand voltage, defect density, and step coverage.

The evaluation of the step coverage was conducted by forming a silicon oxide film on a Al step formed in a line pattern of 0.5 μm in line and space by repeating the film-forming procedures, examining a cross section of the resultant silicon oxide film by means of a scanning electron microscope (SEM), and obtaining a ratio between the film thickness on the step and that on the side of the side wall of the step (that is, a cover factor).

As a result, as for the resultant silicon oxide film, it was found that the film deposition rate is extremely great as much as 200 nm/min, and that the film is of $1 \times 10^{-10}$ A/cm$^2$ in leakage current, $1 \times 10^{16}$ Ω.cm in electric resistivity, 9 MV/cm in withstand voltage, and 0.9 in cover factor, and because of this, the film markedly excels in quality.

Example 4

Using the apparatus shown in FIG. 2 as a article's surface modification apparatus, a surface of a single crystalline silicon substrate was oxidized to form a silicon oxide film usable as a gate insulator of a semiconductor element.

The magnetic field generation means 212 was constituted by a plurality of permanent magnets (commercially available under the trademark name: NEOMAX 40, produced by Sumitomo Special Metals Co., Ltd.). The number of these permanent magnets arranged at the periphery of the RF electrode 106 was adjusted so that a magnetic flux density of 700 Gauss is provided in the plasma generation chamber. The gas introduction position adjusting member 111 was fixed at the position A, described in the foregoing Experiment 1, (that is, the gas introduction position adjusting member 111 is extended to the position situated at the center of the electrode 108). The outlet of the gas feed means 106 serving to supply the reactive gas was fixed at the position c, described in the foregoing Experiment 4.

As the substrate 105, there was used a p-type single crystalline silicon plate (crystal plane: (100), resistivity: 10 Ω.cm). The silicon plate as the substrate 105 was firstly placed on the substrate holder 102. The plasma generation chamber 101 and the deposition chamber 104 were then evacuated to bring their inside to a vacuum of $10^{-6}$ Torr through the exhaust system 104'. Successively, the silicon substrate 105 was heated to 500° C. by energizing the heater 103, and it was maintained at this temperature. Oxygen gas was introduced through the gas feed pipe 109 into the plasma generation chamber 101 at a flow rate of 500 sccm. Then, the inner pressure of each of the plasma generation chamber 101 and the deposition chamber 104 was maintained at a vacuum of 0.03 Torr (P×D product =0.6) by adjusting the conductance valve (not shown) provided at the exhaust system 104'. Successively, the RF power source was switched on to apply a RF power of 100 W (13.56 MHz) into plasma generation chamber 101 through the electrode 108, whereby plasma was generated in the plasma generation chamber 101 while forming a doughnut-like shaped plasma region comprising plasma localized at a high density, wherein the oxygen gas introduced through the gas feed pipe 109 was excited and decomposed to produce active species in the plasma generation chamber 101, the active species thus produced were successively transported toward the silicon substrate 105 in the deposition chamber, and they were chemically reacted with the surface of the silicon substrate 105, whereby causing the formation of a silicon oxide film at a thickness of 50 nm at the surface of the silicon substrate 105 in the deposition chamber. After the film formation completed, evaluation was-made with respect film deposition rate, film quality including leakage current, and withstand voltage.

As a result, as for the resultant silicon oxide film, it was found that the film deposition rate is extremely great as much as 1.2 nm/min, and that the film is of $2 \times 10^{-11}$ A/cm$^2$ in leakage current, $6 \times 10^{16}$ Ω.cm in electric resistivity, and 12 MV/cm in withstand voltage, and because of this, the film markedly excels in quality.

TABLE 1

Film Deposition Rate In Relation With Inner Pressure (P) And Electrode-Substrate Distance (D)

| | P | | | | | |
|---|---|---|---|---|---|---|
| D | 0.01 Torr | 0.02 Torr | 0.05 Torr | 0.1 Torr | 0.2 Torr | 0.5 Torr |
| 5 cm | Δ | ○ | ⊙ | ⊙ | ⊙ | ⊙ |
| 10 cm | Δ | ○ | ○ | ⊙ | ⊙ | ○ |
| 20 cm | Δ | Δ | ○ | ⊙ | ○ | Δ |
| 50 cm | Δ | Δ | ○ | ○ | Δ | Δ |

⊙: more than 300 nm/min;
○: 150–300 nm/min;
Δ: 150 nm/min;
X: less than 50 nm/min;

TABLE 2

Leakage Current In Relation With Inner Pressure (P) And Electrode-Substrate Distance (D)

| | P | | | | | |
|---|---|---|---|---|---|---|
| D | 0.01 Torr | 0.02 Torr | 0.05 Torr | 0.1 Torr | 0.2 Torr | 0.5 Torr |
| 5 cm | X | X | X | ○ | ○ | ○ |
| 10 cm | X | X | ○ | ○ | ○ | ⊙ |
| 20 cm | Δ | Δ | ○ | ○ | ⊙ | ⊙ |
| 50 cm | Δ | ○ | ○ | ⊙ | ⊙ | ⊙ |

⊙: more than $2 \times 10^{-11}$ A/cm$^2$;
○: $2 \times 10^{-11}$–$1 \times 10^{-10}$ A/cm$^2$;
Δ: $1 \times 10^{-10}$–$5 \times 10^{-10}$ A/cm$^2$;
X: less than $5 \times 10^{-10}$ A/cm$^2$;

Figure 1A:
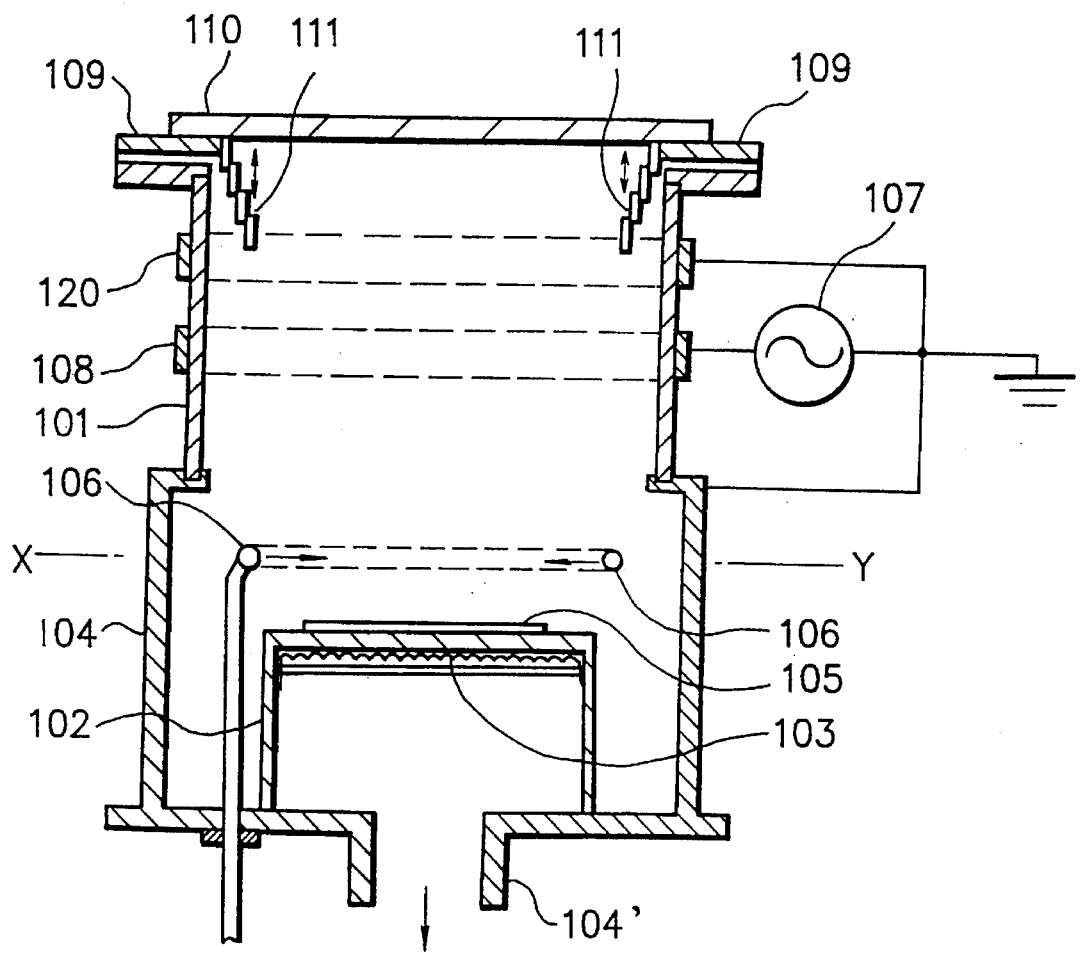
FIG. 1(A) is a schematic view illustrating the constitution of the plasma CVD apparatus used in the experiments conducted upon accomplishing the present invention.

What is claimed is:

1. A process for forming a deposited film by radio frequency (RF) chemical vapor deposition (CVD), process comprising generating plasma in a substantially enclosed plasma generation chamber provided with an electrode arranged at the periphery of said plasma generation chamber by applying a RF power through said electrode into said plasma generation chamber, and forming said deposited film on a substrate placed in a deposition chamber communicated with said plasma generation chamber, wherein said substrate is arranged so as to be isolated from a region where said plasma is generated, comprising:

causing a magnetic field in said plasma generation chamber by means of a magnetic field generation means disposed along said electrode for applying the RF power such that a magnetic flux density with a maximum intensity in a range of from 500 to 1000 Gauss is provided on a side of an inner wall face of said plasma generation chamber and in parallel to said inner wall face;

supplying a plasma generating raw material gas to a zone where said magnetic field resides;

applying the RF power through said electrode to said zone to excite and decompose said plasma generating raw material gas thereby forming a plasma region localized around said electrode while producing active species;

introducing a film-forming raw material gas chemically reactive with said active species into said deposition chamber to chemically react said film-forming raw material gas with said active species, wherein a ratio of Nee/Nes which is expressed by a ratio between an electron density Nes corresponding to an electron density localized around said substrate and an electron density Nee corresponding to an electron density localized around said electrode is adjusted to be 100 or more, and a relationship between a distance D between said electrode and said substrate and an inner pressure P in said deposition chamber is adjusted to satisfy the equation $0.5 \text{ Torr.cm} \leq P \times D \leq 5 \text{ Torr.cm}$, thereby causing the formation of a deposited film on said substrate.

2. The process according to claim 1, wherein the plasma is formed in the vicinity of the electrode using a magnetic field generation means capable of making a magnetic flux density to be in a range of from 600 to 800 Gauss.

3. The process according to claim 1, wherein the magnetic field generation means comprises a permanent magnet.

4. The process according to claim 1, wherein the localized plasma region is seemingly in a single doughnut-shaped state.

5. The process according to claim 1, wherein the RF power is of a frequency in (the) a range of from 1 to 300 MHz.

6. The process according to claim 1, wherein the inner pressure in the deposition chamber is adjusted to a value in (the) a range of from 0.05 to 0.2 Torr.

7. The process according to claim 1, wherein the distance between the electrode and the substrate is adjusted to be in (the) a range of from 10 to 20 cm.

8. The process according to claim 1, wherein the substrate is maintained at a temperature in (the) a range of from 50° to 600° C.

9. The process according to claim 1, wherein the magnetic field generation means is disposed at the periphery of the electrode for applying the RF power.

\* \* \* \* \*

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

It is certified that error appears in the above-identified patent and that said Letters Patent is hereby corrected as shown below:

COLUMN 1

Line 29, "has" should read --is--.
    Line 66, "are occurred, resulting in" should read
       --occur--.

COLUMN 2

Line 57, "are followed by arriving at" should read
       --thereafter reach--.

COLUMN 3

Line 7, "film" should read --films--.
    Line 48, "have" should read --has--.
    Line 66, "state" should read --shape--.

COLUMN 4

Line 1, "resulted" should be deleted.
    Line 20, "electrode" should be deleted.
    Line 37, "state" should read --shape--.
    Line 39, "resulted" should be deleted.
    Line 45, "$N_{ee}/N_{es}$" should read --Nee/Nes--.
    Line 46, "$N_{es}$" should read --Nes--.
    Line 47, "$N_{ee}$" should read --Nee--.
    Line 51, "whereby" should read --thereby--.
    Line 54, "a" should read --an--.

UNITED STATES PATENT AND TRADEMARK OFFICE
CERTIFICATE OF CORRECTION

PATENT NO. : 5,565,247

DATED : October 15, 1996

INVENTOR(S) : NOBUMASA SUZUKI

It is certified that error appears in the above-identified patent and that said Letters Patent is hereby corrected as shown below:

COLUMN 5

Line 61, "inside" should read --insides--.

COLUMN 6

Line 16, "whereby" should read --thereby--.
    Line 31, "an equal" should read --equal--.
    Line 32, "interval" should read --intervals--.
    Line 41, "electron" should read --electrons--.

COLUMN 7

Line 18, "that" should read --to that--.
    Line 56, "um" should read --$\mu$m--.

COLUMN 8

Line 5, "inside" should read --insides--.
    Line 28, "whereby" should read --thereby--.
    Line 40, "Was" should read --was--.
    Line 43, "thereafter as being" should read --the further--.

COLUMN 9

Line 3, "Further in" should read --In--.
    Line 64, "plane" should read --plane:--.

UNITED STATES PATENT AND TRADEMARK OFFICE
CERTIFICATE OF CORRECTION

PATENT NO. : 5,565,247

DATED : October 15, 1996

INVENTOR(S) : NOBUMASA SUZUKI

It is certified that error appears in the above-identified patent and that said Letters Patent is hereby corrected as shown below:

COLUMN 10

Line 4, "inside" should read --insides--.
    Line 33, "changed one" should read --changed to one--.
    Line 39, "shrank" should read --extended--.
    Line 44, "an equal interval" should read --equal intervals--.

COLUMN 11

Line 36, "is occurred as for" should read --of--.
    Line 37, "depending" should read --depends--.

COLUMN 12

Line 23, "an equal interval" should read --equal intervals--.
    Line 25, "plane" should read --plane:--.
    Line 32, "inside" should read --insides--.

COLUMN 13

Line 17, "as the" should be deleted.
    Line 53, "slightly occurred" should read --slight--.
    Line 63, "aiming at finding out" should read --to find--.

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

It is certified that error appears in the above-identified patent and that said Letters Patent is hereby corrected as shown below:

COLUMN 14

Line 27, "plane" should read --plane:--.
    Line 35, "see," should read --see--.
    Line 37, "inside" should read --insides--.
    Line 49, "see," should read --see--.
    Line 62, "whereby" should read --thereby--.

COLUMN 15

Line 28, "knowledges" should read --facts--.
    Line 48, "due to that" should read --due to the fact that--.
    Line 63, "due to that" should read --due to the fact that--.

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

It is certified that error appears in the above-identified patent and that said Letters Patent is hereby corrected as shown below:

Line 56, "is to provide" should read --provides--.

COLUMN 17

Line 7, "residues through" should read --resides through--.
    Line 23, "pxD" should read --PxD--.
    Line 23, "whereby" should read --thereby--.
    Line 29, "with a frequency" should be deleted.
    Line 33, "use" should read --to use--.
    Line 34, "shape" should be deleted.
    Line 37, "invention which" should be read --invention,which--.
    Line 38, "electron" should read --electrons--.
    Line 44, "there" should be deleted.
    Line 45, "can be illustrate" should be deleted.
    Line 46, "electromagnets" should read --electromagnets may be used--.
    Line 47, "employed" should read --employed the--.

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

It is certified that error appears in the above-identified patent and that said Letters Patent is hereby corrected as shown below:

COLUMN 18

Line 51, "under" should read --hereunder--.

COLUMN 19

Line 3, "residues through" should read --resides through--.
    Line 18, "pxD" should read --PxD--.
    Line 30, "metal" should be deleted.
    Line 31, "alloy" should be deleted.
    Line 63, "film" should read --films--.

COLUMN 20

Line 60, "any" should read --either--.

COLUMN 21

Line 21, "localize" should read --localized--.

COLUMN 22

Line 11, "whereby" should read --thereby--.

COLUMN 23

Line 4, "whereby" should read --thereby--.
    Line 8, "respect" should read --respect to--.
    Line 42, "firstly" should read --first--.

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

It is certified that error appears in the above-identified patent and that said Letters Patent is hereby corrected as shown below:

```
    Line 45, "inside" should read --insides--.
    Line 59, "whereby" should read --thereby--.
```

COLUMN 24

```
    Line 2,  "whereby" should read --thereby--.
    Line 4,  "formation" should read --formation was--.
    Line 5,  "respect" should read --respect to--.
    Line 31, "beam" should read --beams--.
    Line 53, "firstly" should read --first--.
    Line 56, "inside" should read --insides--.
```

COLUMN 25

```
    Line 15, "whereby" should read --thereby--.
    Line 18, "respect" should read --respect to--.
    Line 57, "firstly" should read --first--.
    Line 60, "inside" should read --insides--.
```

COLUMN 26

```
    Line 13, "whereby" should read --thereby--.
    Line 16, "was-made" should read --was made--.
    Line 16, "respect" should read --respect to--.
    Line 38, "150" should read --50~150--.
    Line 56, "less" should read --more--.
    Line 53, "more" should read --less--.
```

UNITED STATES PATENT AND TRADEMARK OFFICE
CERTIFICATE OF CORRECTION

PATENT NO. : 5,565,247

DATED : October 15, 1996

INVENTOR(S): NOBUMASA SUZUKI

Figure 1B:
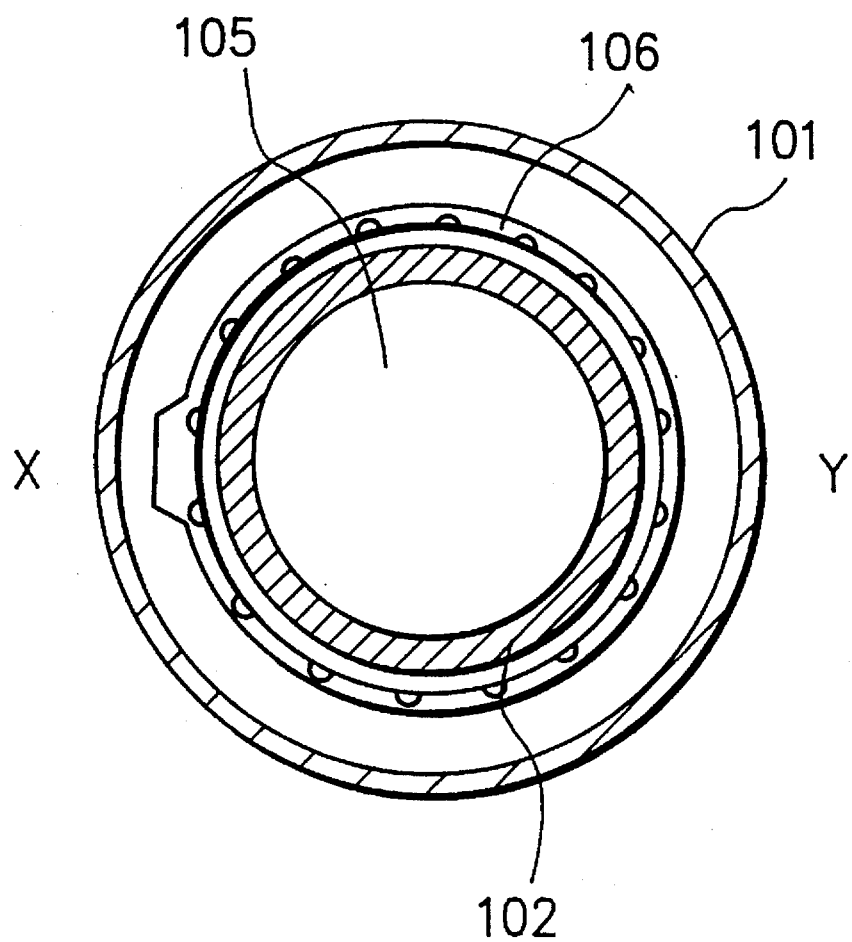
FIG. 1(B) is a schematic cross section view, taken along the X–Y line in FIG. 1(A) and viewed from above.
Figure 2:
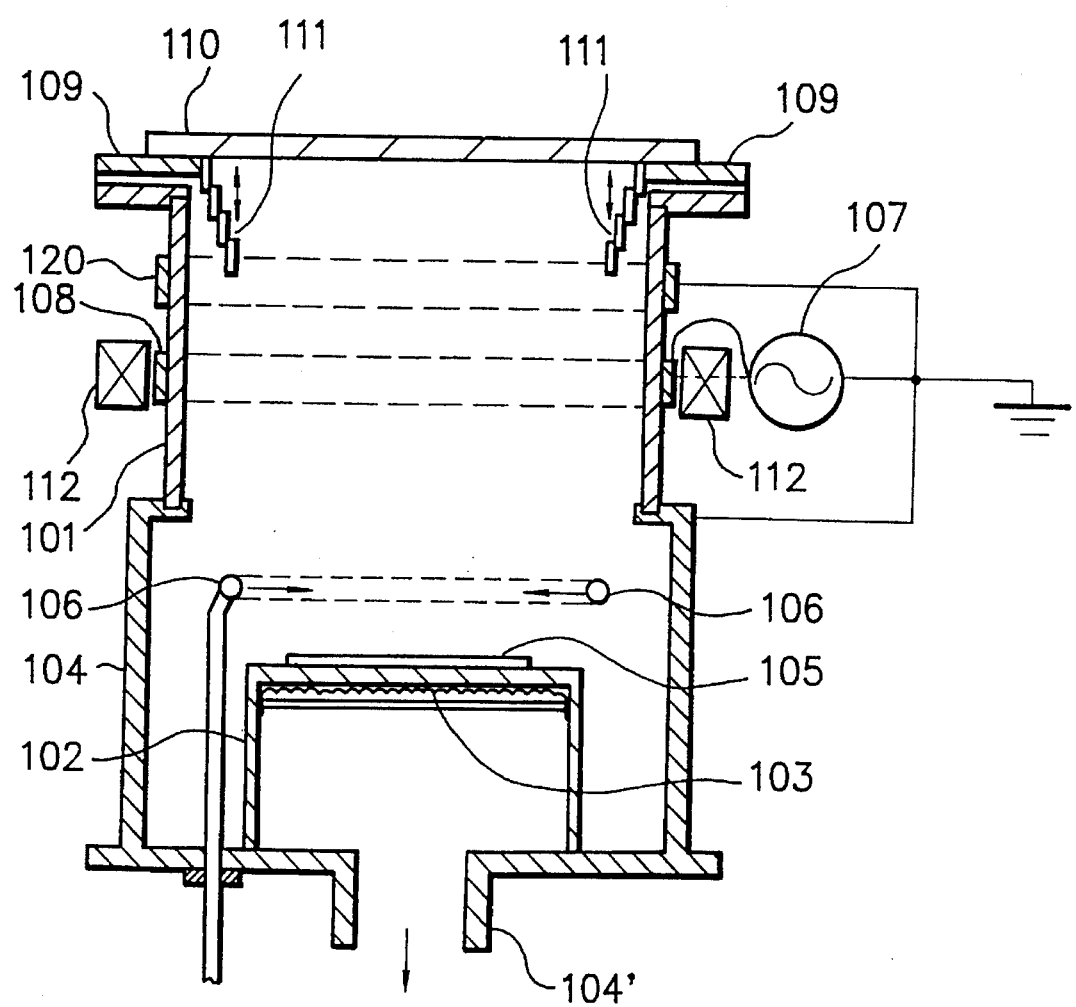
FIG. 2 is a schematic view illustrating the constitution of an example of a plasma CVD apparatus which is suitable for practicing the process according to the present invention.
Figure 3:
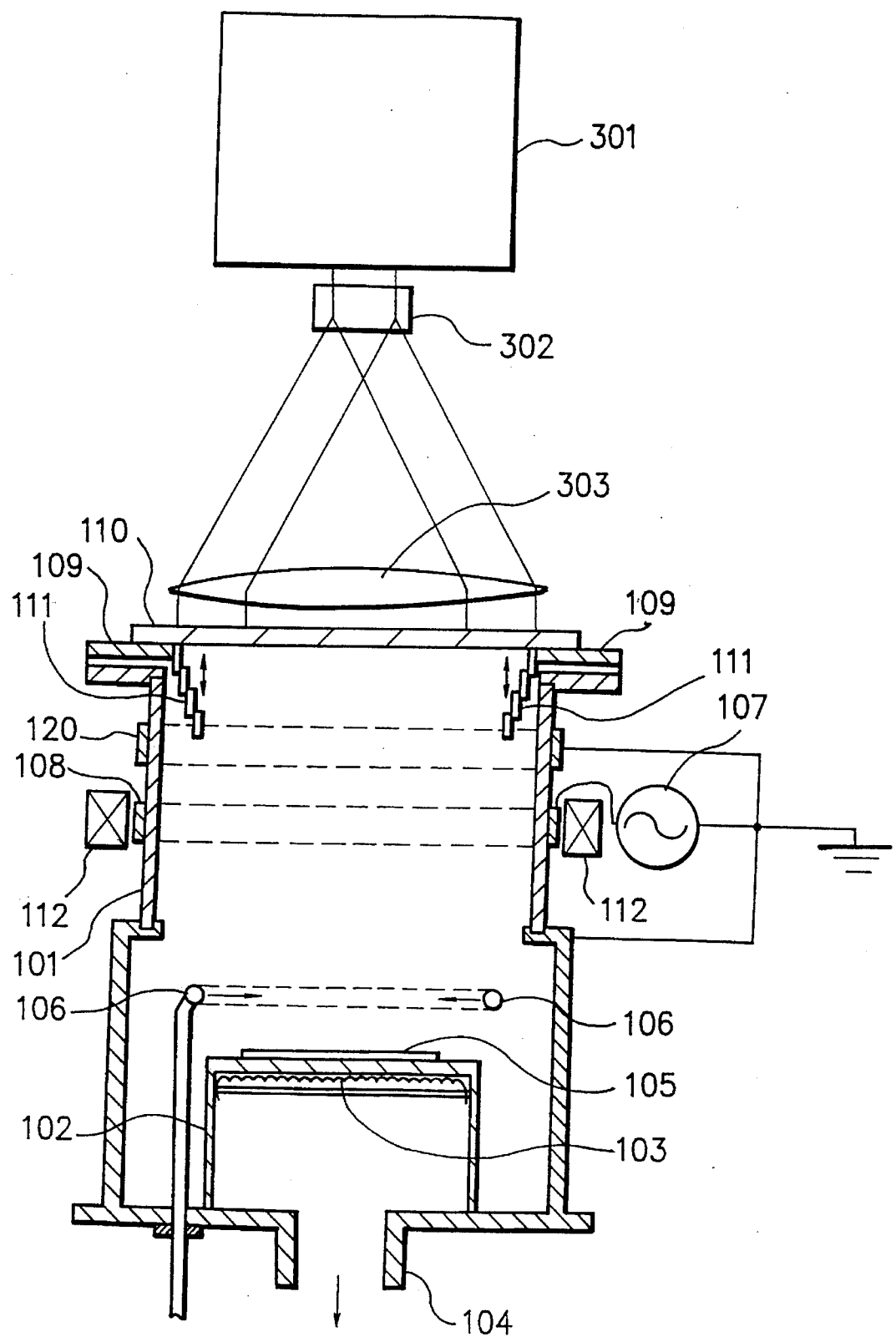
FIG. 3 is a schematic view illustrating the constitution of another example of a plasma CVD apparatus which is suitable for practicing the process according to the present invention.
Figure 4:
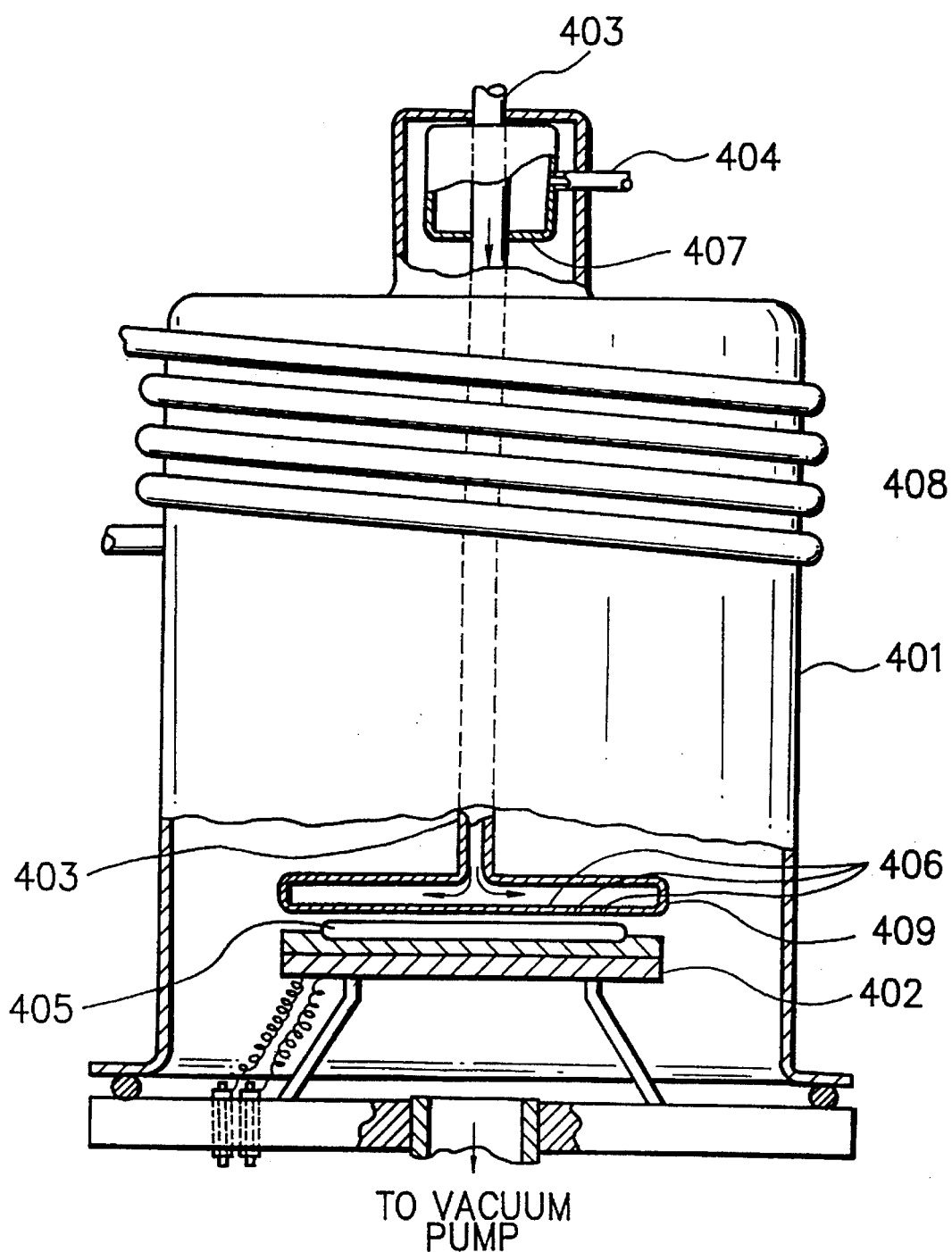
FIG. 4 is a schematic explanatory view of the prior art.

It is certified that error appears in the above-identified patent and that said Letters Patent is hereby corrected as shown below:

Line 58 through COLUMN 27, line 5, "BRIEF DESCRIPTION OF THE DRAWINGS ¶ FIG. 1(A) is a schematic view illustrating the constitution of the plasma CVD apparatus used in the experiments conducted upon accomplishing the present invention. ¶ FIG. 1(B) is a schematic cross section view, taken along the X-Y line in FIG. 1(A) and viewed from above. ¶ FIG. 2 is a schematic view illustrating the constitution of an example of a plasma CVD apparatus which is suitable for practicing the process according to the present invention. ¶ FIG. 3 is a schematic view illustrating the constitution of another example of a plasma CVD apparatus which is suitable for practicing the process according to the present invention. ¶ FIG. 4 is a schematic explanatory view of the prior art." should be deleted.

UNITED STATES PATENT AND TRADEMARK OFFICE
CERTIFICATE OF CORRECTION

PATENT NO. : 5,565,247

DATED : October 15, 1996

INVENTOR(S) : NOBUMASA SUZUKI

It is certified that error appears in the above-identified patent and that said Letters Patent is hereby corrected as shown below:

<u>COLUMN 28</u>

```
Line 21, "(the)" should be deleted.
Line 25, "(the)" should be deleted.
Line 28, "(the)" should be deleted.
Line 30, "(the)" should be deleted.
```

Signed and Sealed this

Twenty-sixth Day of August, 1997

Attest:

BRUCE LEHMAN

*Attesting Officer*  *Commissioner of Patents and Trademarks*